INVENTOR.
Richard S. Burwen
BY
Roberts Cushman & Grover,
ATT'YS.

United States Patent Office 3,364,357

Patented Jan. 16, 1968

3,364,357

TEMPERATURE COMPENSATED PHOTO-ELECTRIC CONTROL SYSTEMS

Richard S. Burwen, Lexington, Mass., assignor to Farmer Electric Products Co., Inc., Natick, Mass., a corporation of Massachusetts Filed Dec. 28, 1964, Ser. No. 421,198
9 Claims. (Cl. 250—214)

ABSTRACT OF THE DISCLOSURE

A control circuit, of the type having a photoconductor controlling a silicon transistor, has temperature compensation provided by a plurality of forward biased diodes. The voltage across the forward biased diodes appears across a voltage divider comprising the photoconductor and a series impedance. The base of the silicon transistor is connected to the junction of photoconductor and series impedance. The number of forward biased diodes is selected to be $n+1$, where $n$ is the ratio of photoconductor impedance to series impedance at which it is desired to have the transistor begin to conduct. Because the transistor critical base-emitter voltage varies with temperature in the same manner as the voltage across the forward biased diodes, the transistor will begin to conduct at the same value of photoconductor impedance regardless of temperature.

The field of this invention relates to photoelectric control systems, and more particularly to a temperature compensated photoelectric control system employing transistors. Presently available transistors, especially those of the silicon type, have a rather sharply defined critical emitter-base voltage at which the transistor begins to conduct through its emitter collector circuit. The particular value of base voltage at which such transistors will conduct is, however, quite temperature dependent. For example for a nominal emitter-base voltage of about 0.65 volt of a silicon diode, the temperature coefficient will be approximately 2.5 millivolts per degree centigrade.

If a photocell is used to drive such a transistor in bridge or voltage divider circuits which are particularly suited for such purposes, the ultimate sensitivity of the system will be dependent upon ambient temperature owing to the temperature sensitivity of the emitter-base junction which operates as a detector or discriminator.

Similarly, timing circuits such as resistance capacitance networks, which operate into a silicon transistor input stage can be affected in their timing if the voltage which they must achieve before triggering the next stage, is dependent upon temperature.

Objects of the present invention are accordingly to provide a simple and inexpensive transistorized photoelectric control system in which the light sensitivity of the system is relatively independent of the temperature at which the circuitry is operated; to provide such systems in which the time response and timing characteristics, if any, are relatively independent of temperature; and to provide such systems which will operate in a variety of control modes, such as after a predetermined delay, or for a predetermined period after initiation, or in various latching or lock-up modes.

The nature of the invention may be summarized as follows.

For purposes of temperature compensation of a photoelectric control circuit in which a photocell is arranged in a voltage divider or bridge circuit driving a transistor having a critically temperature dependent emitter-base voltage, the present invention contemplates in one aspect supplying the photocell network with current from a source which is shunt-regulated by means of a plurality of forward-biased of similarly temperature dependent diodes. The use in the driving photocell network of diodes of semiconductor material similar to that of the driven transistor assures that the temperature coefficient of the diode string will bear the same relation to the total forward voltage drop across the string as the temperature coefficient of the photocell network transistor bears to its emitter-base voltage drop. The number of diodes is chosen so that the thereby regulated source voltage, when divided in the network incorporating the photocell, will be essentially equivalent in total voltage and temperature coefficient to the corresponding characteristics of the emitter-base junction of the photocell network transistor.

The invention further contemplates use of the diode compensated voltage source as the current supply for any timing networks in the photoelectric system which operate into similar, temperature sensitive emitter-base junctions. For example, if an RC network is arranged so that a capacitor is charged through a resistor to a voltage appropriate for rendering conductive a silicon transistor, the resistor can employ the diode regulated supply as its current source. In this way, if the voltage to which the capacitor must be charged varies with temperature, the charging rate will vary correspondingly in a compensating manner.

These and other objects, inventive aspects and advantages will appear from the following description of several practical embodiments.

The description refers to embodiments of the invention shown in the accompanying drawings in which.

Each of the transistorized photoelectric control systems herein shown and described by way of illustration is arranged for operation on power taken from standard 115 volt AC mains. For this purpose, each can be provided with a main DC power supply for providing direct current at an unregulated potential of approximately 18 volts, this being a voltage suitable for the operation of transistors. Such a power supply can involve a suitable voltage reducing transformer T1, a full wave rectifier bridge BR employing four diodes, D1–D4, and a filter capacitor C1 across DC output terminals *a*, *b*. This power supply is shown only in FIG. 1, the other figures merely showing the power input terminals *a*, *b*.

Figure 1:
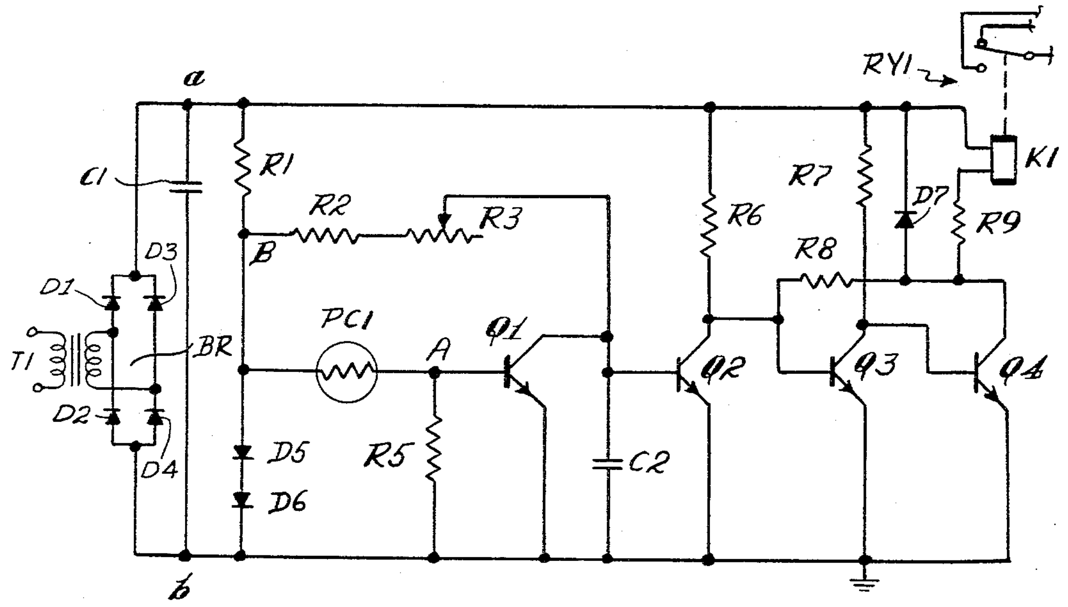
FIG. 1 is a schematic diagram of a transistorized photoelectric control system in which a relay is operated after a predetermined time interval following interruption of a light signal.

In the apparatus illustrated in FIG. 1, the first stage or input transistor Q1 is of an NPN silicon type, connected with its emitter grounded to the negative terminal side of the main power supply. It is a characteristic of this type of transistor that virtually no conduction takes place through the emitter-collector output circuit until the base is brought to a potential of approximaely 0.65 volt more positive than the emitter. This voltage is essentially the voltage necessary to overcome the emitter-base diode barrier voltage. As well known, this critical voltage for conduction is temperature dependent with a negative coefficient of approximately 2.5 millivolts per degree centigrade.

In order to provide a rapid transition from the conducting to the non-conducting states in the transistor Q1, it is highly desirable that the sensing photocells, which may be considered to be a variable resistance, be connected in a bridge or voltage dividing circuit so that, as the photocell resistance varies the output voltage of the voltage divider, this output voltage may be compared with a reference voltage. In the circuit of FIG. 1 the reference voltage is the 0.65 volt required to turn on the transistor Q1. It will be appreciated that it is undesirable that the sensitivity of the photoelectric control device vary with temperature, following the temperature dependency of the emitter-base voltage of transistor Q1.

To provide a voltage source which can be divided to obtain the desired 0.65 volt and which also provides compensation for the temperature variations of the emitter-base voltage, the present invention supplies the voltage divider network with power by connection in parallel with a plurality of series connected, forward-biased diodes which are of the same semiconductor material as the transistor Q1.

In the apparatus FIG. 1, a cadmium sulfide photocell PC1 is connected in series with a resistor R5 to form a voltage divider and the junction A between the two, constituting the output of the voltage divider, is connected to the base of input transistor Q1. A pair of series connected silicon diodes D5 and D6 are conneced to the main unregulated power supply through a resistor R1, these diodes being oriented so as to be forward-biased. As will be understood by those skilled in the art, the level of current passing through the diodes D5 and D6 depends almost entirely on the value of the resistor R1, the voltage appearing across the diodes being during constant current operation determined essentially entirely by the diode forward-voltage drop or barrier voltage. Since the diodes D5 and D6 are constructed of the same type of semi-conductor material as the transistor Q1, here silicon, the voltage across each diode will be essentially equal to the emitter-base diode voltage required to render the transistor Q1 conductive.

Since there are two diodes, the voltage across the pair will be essentially double the silicon barrier voltage, or about 1.3 volts. The diodes, in a sense, provide shunt regulation. Since the regulated source voltage is double the critical emitter-base voltage, the transistor Q1 will be turned on when the resistance of the photocell PC1 is just equal to that of resistor R5 so that the source voltage supplied to the divider network is halved.

Further, since the diode regulated voltage supplied to the divider network will have twice the negative temperature coefficient of a single silicon diode and since this coefficient will also be just halved when the photocell resistance is equal to that of resistor R5, the temperature caused variation of the critical emitter-base voltage in the transistor Q1 will be quite accurately compensated for. In other words, since the regulated supply voltage and the critical voltage of the transistor fluctuate proportionately, the operation of the control circuitry is conditioned almost solely by the ratio of the voltage divider resistances.

While the transistor Q1 in the illustrated circuit is turned on when the divider resistances are equal, it will be evident from the nature of the compensation provided, that other integer ratios of divider resistances can be employed if the number of shunt regulating diodes is adjusted accordingly. For example, the circuit would operate when the ratio of photocell resistance to fixed resistance were 2 to 1, with three shunt diodes used. In that case the supply voltage and its temperature coefficient would be triple that of the emitter-base voltage for the transistor and each of these values would be reduced to ⅓ in the divider circuit so as to properly operate and compensate the input transistor Q1. It can be seen that the number of series diodes required is $n+1$ where $n$ is the ratio of resistances expected to produce the critical voltage.

Fixed resistor R2 and variable resistor R3 form the load resistance for the transistor Q1. The collector of input transistor Q1 is directly connected to the base of an NPN silicon amplifier transistor Q2. This junction is also connected to ground through capacitor C2 for a purpose to be discussed hereinafter. Resistor R6 provides a load for the collector of transistor Q2 and this collector circuit is directly coupled to a conventional level trigger circuit with silicon NPN transistors Q3 and Q4. Within this trigger circuit the transistor Q3 is provided with a load resistor R7 and its collector is directly coupled to the base of a NPN silicon transistor Q4. Transistor Q4 is of a type capable of handling substantial power and the coil K1 of relay RY1 is included in the collector load circuit in series with a fixed resistance R9. A diode D7 bridging the load circuit prevents the energy inductively stored in the coil from causing a transient which might damage the transistor Q4 when the relay is de-energized. Regenerative feedback for supplying the flip-flop action characteristic of the level trigger circuit is provided by resistor R8 which couples the collector of output transistor Q4 to the base of transistor Q3. The trigger circuit provides a very sharply defined operation of the relay RY1 and prevents any hunting or chattering which might otherwise be cause by the comparatively slow energization of the amplifier transistor Q2.

As stated above, the collector of input silicon transistor Q1 is directly coupled to the base of amplifier transistor Q2. The latter is also an NPN silicon type having a critical emitter-to-base voltage of approximately 0.65 volt. Since the saturation voltage of Q1 (a few millivolts) is substantially less than this critical voltage, the transistor Q2 will be cut off when the photocell PC1 is illuminated so as to turn on the transistor Q1. The capacitor C2 will then be essentially discharged.

The apparatus of FIG. 1 is arranged so that the operation of the relay is not instantaneous with the removal of light from the photocell, but occurs after an adjustable delay. In normal operation enough light is impressed upon the photocell PC1 so that its resistance is lowered to apply more than 0.65 volt to the base of transistor Q1. That transistor thus becomes saturated and discharges capacitor C2 to a very low voltage in the order of a few millivolts. When light is removed from the photocell PC1, its resistance increases, the output voltage from the voltage divider, at A, drops and the input transistor Q1 is cut off. With transistor Q1 turned off, the capacitor C2 will charge through the load resistance R2, R3 for the transistor Q1. The variable resistor R3 can be adjusted to vary the rate at which C2 is charged. In this way an adjustable delay is provided. When C2 has charged to the critical base voltage of the transistor Q2, that transistor becomes conductive and triggers the Schmitt trigger stage to energize the relay RY1.

It would be undesirable for the above discussed delay to depend directly upon the temperature dependent emitter base voltage of the transistor Q2. To avoid this defect in accordance with the invention, the load resistance for the transistor Q1 is connected to the diode regulated voltage source at B rather than directly to the unregulated main power supply. Since the diode regulated voltage and the emitter-base critical voltage vary proportionately, the charging rate for the capacitor C2 varies in a manner which compensates for the changes in voltage to which the capacitor must be charged before energizing transistor Q2.

The circuit shown in FIG. 1 is arranged for dark operation, that is, the relay RY1 is energized when the light illuminating the photocell PC1 is cut off, thereby causing this cadmium sulfide cell to exhibit high resistance. However, since the photocell network is in the form of a voltage divider having equal resistance legs at the critical point, light operation, that is the energization of the relay RY1 with the application of light, can be easily obtained by interchanging the photocell PC1 and the fixed resistor R5.

Figure 2:
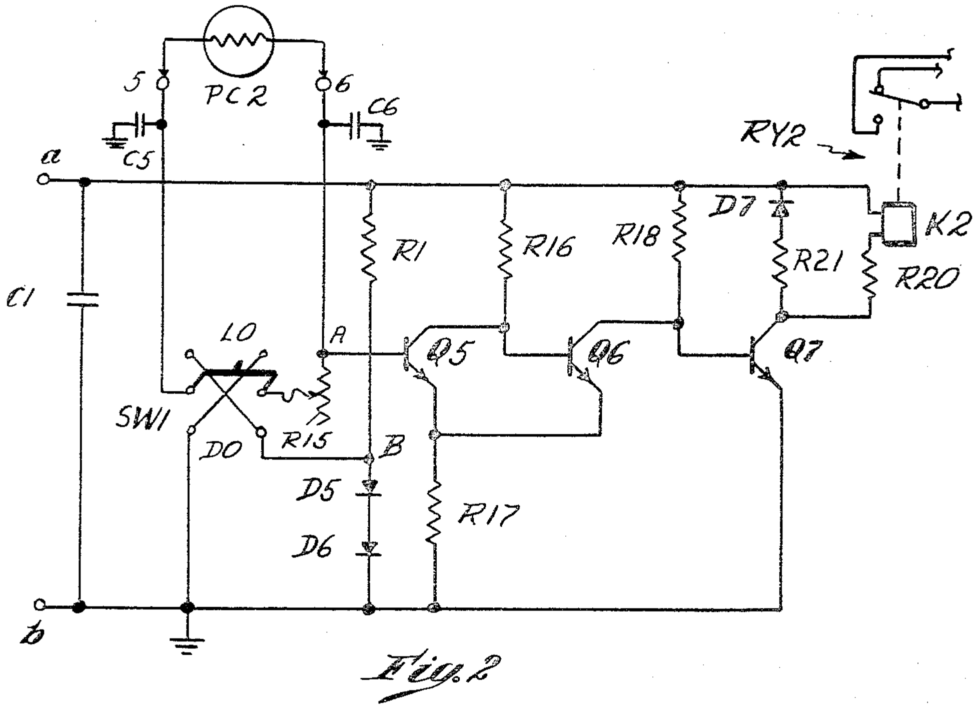
FIG. 2 shows a simpler embodiment in which a relay is operated in direct on-off correspondence with a light signal.

FIG. 2 illustrates a modification in which a relay RY2 is operated directly with the application or withdrawal of light from the photocell, without delay. The main power supply at *a*, *b* is the same as that of FIG. 1. Similarly, diodes D5 and D6 supplied with current through resistor R1 again provide a shunt regulated and temperature compensating source of low voltage for supplying at B a photoresponsive voltage divider. In this modification, a cadmium sulfide photocell PC2 is shown as a separable unit which can be connected to the control circuitry at terminals 5 and 6. Capacitors C5 and C6 shunting these terminals to ground have the purpose of filtering out the high frequency transients which may be picked up by the leads connecting the photocell and the control circuitry. The photocell PC2 is connected in a voltage dividing network with resistor R15, whose resistance is variable so that the light level which produces balance in the voltage divider can be conveniently adjusted. A reversing switch SW1 is provided so that either light operation with the contacts on L0 or dark operation with the contacts on D0 can be provided by thus electrically interchanging the photocell PC2 and the resistor R15.

Instead of driving an amplifying input stage directly as in FIG. 1, the light sensitive voltage divider shown in FIG. 2 is arranged to operate directly into a level trigger circuit with NPN silicon transistors Q5 and Q6. In this trigger circuit, the transistor Q5 is provided with a load resistor R16 and connected directly to the base of transistor Q6. Regeneration to obtain trigger or flip-flop action is obtained by means of the common emitter resistance R17. The resistor R17, though desirable for best operation of the trigger circuitry, is chosen of a very low value so that the IR voltage drop across this resistance is small in comparison with the 0.65 emitter to base voltage drop in the silicon transistor Q5. Since this IR voltage drop is small, the critical voltage at the base of transistor Q5 behaves with temperature change virtually as does the critical voltage at the base of the input transistor Q1 of FIG. 1. Accordingly, the same temperature compensating advantages flow from the use of diode voltage regulation in supplying the photocell network.

The second transistor Q6 in the trigger circuit is provided with a load resistor R18 and its collector is further connected to the base of an NPN silicon power transistor Q7. The collector circuit of the power transistor Q7 includes the coil K2 of a relay RY2 and a series connected current limiting resistor R20. This load circuit is bridged by a diode D7 and a series resistor R21 which functions in conventional manner to dampen switching transients which otherwise might damage the transistor Q7.

With the reversing switch SW1 set for light operation as illustrated, the operation of this system is as follows. Without any light on the photocell PC2 the voltage at the base of transistor Q5 will be less than 0.65 volt and that transistor will not be conductive. Current from the power supply coming through the resistor R16 will cause Q6 to conduct to saturation. The saturation voltage thus present at the collector transistor Q6 will be insufficient to cause conduction in the transistor Q7 and the relay RY2 will thus not be energized.

The application of sufficient light to the photocell PC2, causing its resistance to become less than that of R15, causes transistor Q5 to become conductive. Because of the regeneration present in the trigger circuit with Q5 and Q6, the transistor Q6 will be abruptly turned off and current from the power supply flowing through R18 will now turn on the power transistor Q7 thereby energizing the relay.

Figure 3:
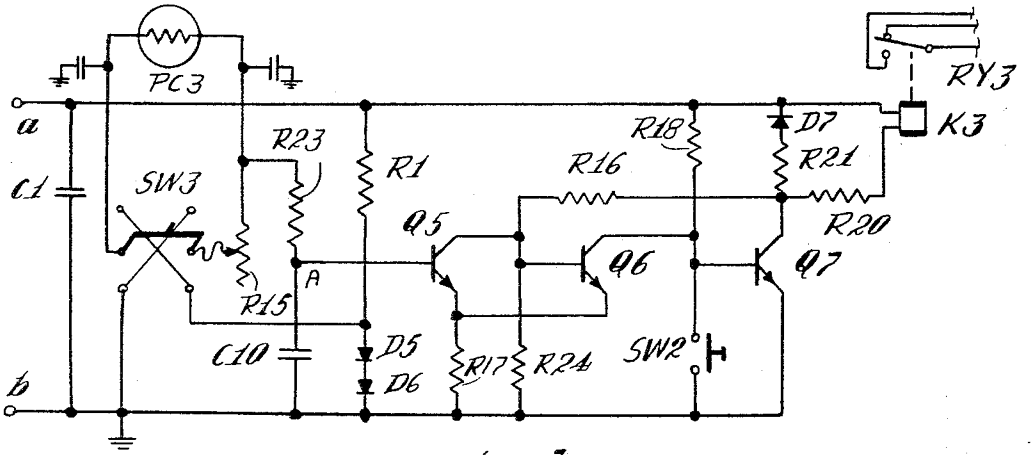
FIG. 3 shows a modification of the apparatus shown in FIG. 2, with a latching feature added.

FIG. 3 illustrates a modification of the photoelectric control circuit shown in FIG. 2. The power supply is again connected to terminals *a*, *b*, similar to the embodiments according to FIGS. 1 and 2, and also the additional embodiments according to FIGS. 4 and 5. This modification provides a latching operation whereby once the relay is actuated it remains actuated until reset, whether or not the initiating light signal is continued. This latching is obtained by connecting the load resistor R16 for the transistor Q5, not to the power supply as in FIG. 2, but rather to the output or collector circuit of the power transistor Q7. This connection provides a regenerative feedback around a loop including the transistors Q6 and Q7 and resistor 24. The effect of this regeneration is so strong that it completely removes all source of current for the transistor Q5 so that this transistor and the photocell network completely lose control of the relay RY2. Therefore, once the photocell has initiated those changes in circuit conditions which cause the energization of the relay, the relay will remain energized indefinitely without regard to light conditions at the photocell. The circuit according to FIG. 3 provides additional filtering of the input by way of an RC filter circuit incorporating a series resistor R23 and a shunt capacitor C10 connected to the base of transistor Q5.

The latching circuit of FIG. 3 can be reset preparatory to a new cycle of operation by momentarily grounding the base of output transistor Q7, as by the pushbutton switch SW2. This stops conduction in the output circuit so that the voltage at the collector of transistor Q7 returns to approximately the power supply potential. Current is then available to the transistor Q5 through its load resistor R16 so that the photocell network and the trigger circuit can again exert control over the output stage.

The embodiment shown in FIG. 4 employs the power supply described with reference to FIG. 1 and common to each of the modifications and also uses the reversible, variable sensitivity photocell network shown in FIGS. 2 and 3, including the various high frequency transient filters. Similar reference characters are applied to these components. This embodiment is also provided with a similar diode regulated low-voltage power supply for the photocell network. The supply includes the series silicon diodes D10 and D11 which are forward biased by current from the main power supply flowing through the current-value-determining resistor R30.

The output voltage from the photosensitive voltage divider is coupled, through the transient filter including R23 and C10, into a Schmitt level trigger circuit which involves the NPN silicon transistors Q11 and Q12 and resistors R31, R32 and R33. This level trigger circuit does not, however, operate the power output stage directly as does the trigger circuit shown in FIGS. 2 and 3, but rather this input stage is employed only to obtain a sharp pulse signal which indicates a change in light intensity through the critical level. Pulses from the Schmitt trigger circuit are coupled, through a DC blocking capacitor C12 into a two-stage amplifying circuit employing NPN silicon transistors Q13 and Q14, bias resistor R35 and load resistors R36 and R37. The emitter-collector circuit of the transistor Q14 is bridged by a timing capacitor C13 for a purpose discussed hereinafter.

The collector of the amplifier stage transistor Q14 is direct coupled to the base of the first transistor Q15 of a power-switching level trigger circuit employing in addition to the NPN silicon transistor Q15 a NPN silicon power transistor QQ16. The collector load circuit of the power transistor Q16 includes the coil K4 of the output relay RY4 and a series current limiting resistor R20. This load circuit is bridged by a shunt transient suppressing network consisting of the diode D12 and resistor R39. The collector of the first transistor Q15 in the Schmitt trigger circuit is provided with a load resistor R40 and is directly coupled to the base of the power transistor Q16. An emitter resistor R41 is common to both Q15 and Q16 and provides regeneration to cause the flip-flop action characteristic of the trigger circuit.

Figure 4:
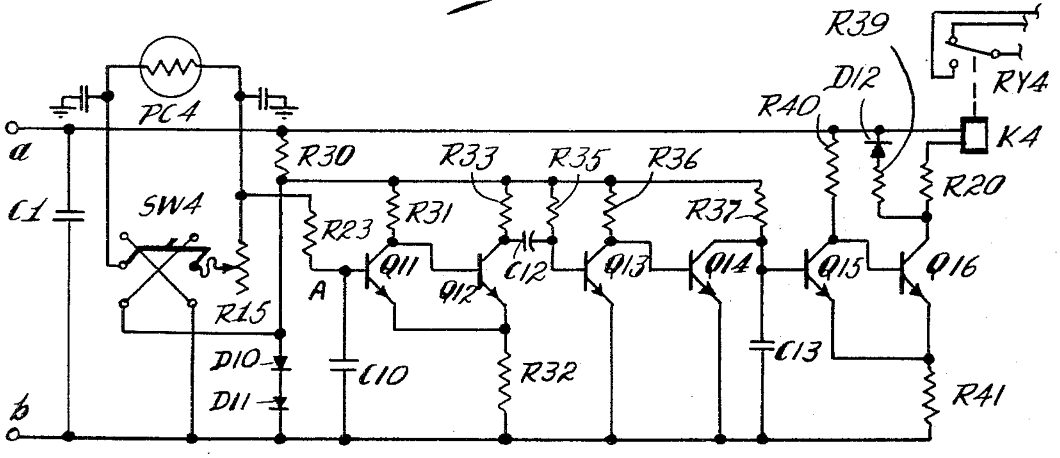
FIG. 4 is a schematic diagram of a photoelectric control system which energizes a relay for a predetermined interval following an initiating light signal.

The operation of the embodiment illustrated in FIG. 4 is as follows. In the absence of any change in light conditions, that is with the Schmitt trigger circuit including Q11 and Q12 in either of its stable states, the first stage amplifier transistor Q13 is biased into conduction by resistor R35. The low saturation voltage present at the collector of transistor Q13 causes the following transistor Q14 to be cut off. Accordingly, current flowing through R37 will have charged capacitor C13 to a voltage such that the power switching Schmitt trigger circuit will assume its stable state in which Q15 is conductive and output transistor Q16 is cut off, thereby de-energizing the relay RY4.

Assuming the reversing switch SW4 to be in the light operating position as illustrated, an increase in light on the photocell PC4 through the critical level will lower the voltage at the base of transistor Q11 thereby turning it off. Because of the flip-flop action in the trigger circuit the second transistor Q12 will abruptly become conductive and a negative going pulse will be coupled into the base of transistor Q13 through capacitor C12. The negative going pulse will cut off the transistor Q13 and the increase in voltage at the collector thereof will cause conduction in the transistor Q14. The capacitance of C12 is chosen so that the length of the pulse is sufficient, when amplified by both Q13 and Q14, essentially to completely discharge the timing capacitor C13.

When C13 is discharged the transistor Q15 is cut off and, through the operation of the trigger circuit within which it is incorporated, the power transistor Q16 is abruptly turned on, energizing the relay RY4.

Although the timing capacitor C13 is initially almost completely discharged by the amplified pulse, it immediately begins to recharge due to current flowing through R37. Once it reaches that base voltage at which transistor Q15 again begins to conduct, the output trigger circuit will again revert to its former state, de-energizing the relay RY4. Thus a light input signal in the proper direction will cause energization of the relay for a period of time which is predetermined by the values of R37 and C13. As will be understood by those skilled in the art, the duration of relay energization is independent of the time during which the light condition persists, owing to the DC decoupling action of the capacitor C12.

It should be noted that the resistor R37 draws current not directly from the main power supply, but from the voltage source which is shunt-regulated by the diodes D10 and D11. Accordingly, although the base voltage at which the transistor Q15 becomes conductive will vary with temperature, the rate at which the timing capacitor C13 becomes recharged will vary in a compensating manner, due to the temperature variation in the forward voltage drop across the diodes D10 and D11. Therefore, here also the duration of energization of the relay RY4 is relatively independent of the ambient temperature.

In order to utilize the known benefits of a stable voltage source in triggering circuits, the embodiment of FIG. 4 is so arranged that each of the four low level transistors Q11–Q14 is supplied from the diode regulated low voltage source point A.

Figure 5:
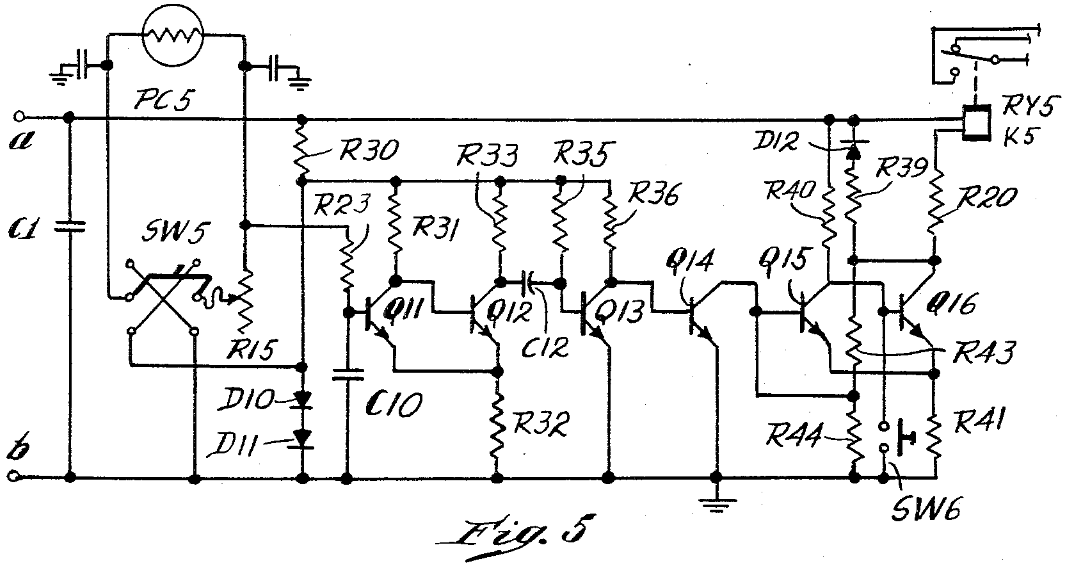
FIG. 5 shows a modification of the apparatus of FIG. 4, incorporating a latching brake.

FIG. 5 illustrates a modification of the apparatus shown in FIG. 4. This modification provides a latching action similar to that obtained with the apparatus shown in FIG. 3. In this modification the load resistor R37 and the timing capacitor C13 of FIG. 4 are omitted and current for the collector circuit of transistor Q14 is instead obtained from the collector of output transistor Q16 through a voltage dividing network which includes resistors R43 and R44. This connection provides large additional amounts of regenerative feedback to the extent that, once the circuit is triggered and the relay RY5 is energized, all source of current for the collector circuit of the transistor Q14 is effectively removed due to the low saturation voltage of the transistor Q16. Accordingly, the photocell network and the input trigger circuit lose all control over the relay.

Resetting of the apparatus according to FIG. 5 preparatory to a new cycle of operation is obtained by momentarily grounding the base of the transistor Q16 as by normally open push-button switch SW6.

It should be understood that the present disclosure is for the purpose of illustration only and that this invention includes all modifications and equivalents which fall within the scope of the appended claims.

I claim:

1. In an electronic control system in which a condition sensing variable impedance and a reference impedance form a voltage divider, the voltage variable junction of which is employed to control a transistor rendered conductive by an essentially critical temperature dependent emitter-base voltage, a temperature compensated voltage supply for said voltage divider comprising:
- a main power supply; and
- a current determining impedance and a plurality of forward biased semi-conductor diodes of the same semi-conductor material as said transistor series connected across said power supply, said plurality of series diodes being parallel connected across said voltage divider, the number of diodes being $n+1$ where $n$ is the ratio of said sensing and reference impedances for which it is desired to render said transistor conductive.

2. A transistorized, temperature compensated photocell controlled circuit comprising:
- a main power supply;
- a current determining impedance;
- a pair of silicon diodes, said diodes and said current determining impedance being connected in series across the main power supply with said diodes being forward biased so as to provide a shunt-regulated voltage source;
- a photosensitive impedance;
- a reference impedance;
- said reference impedance and said photosensitive impedance being connected in series across said diodes so as to form a photoresponsive voltage divider; and
- a silicon input transistor, the emitter-base junction of which is connected across that arm of said voltage divider which is connected to the main power supply and the collector circuit of which is connected for driving a controlled circuit;
- whereby the value of light intensity falling upon said photosensitive impedance which will render said silicon input transistor conductive, is relatively independent of the temperature of the transistor.

3. A control circuit according to claim 2 further comprising:
- a power switching circuit having at least one silicon transistor stage; and
- a timing network for driving the emitter-base circuit of said silicon transistor stage, said timing network being connected to said shunt regulated voltage source;
- whereby the timing is substantially independent of temperature.

4. A control circuit according to claim 3 in which said timing network includes a resistor connecting the base of said silicon transistor stage to said shunt regulated source, and a capacitor shunting the emitter-base circuit of said silicon transistor stage.

5. A control circuit according to claim 2 further comprising:
- a load resistor for the collector circuit of said silicon input transistor, said load resistor being connected to said shunt regulated voltage source;
- a timing capacitor shunting said collector circuit; and
- a power switching circuit having a silicon transistor input stage;
- whereby non-conductivity of said silicon input transistor causes operation of the power switching circuit only after a predetermined delay which is substantially independent of temperature.

6. A control circuit according to claim 2 further comprising:
 a level trigger stage incorporating said silicon input transistor;
 a relay; and
 a power transistor controlled by said trigger circuit for energizing said relay.

7. A control circuit according to claim 6 further comprising regenerative feedback means for causing said trigger stage to latch so that, once said relay is energized, said photocell loses control thereof.

8. A control circuit according to claim 2 further comprising:
 a pulse forming input level trigger circuit incorporating said silicon input transistor;
 means for amplifying pulses from said trigger circuit;
 a capacitor connected for discharge by the amplified pulses;
 a resistor connecting said capacitor to said shunt regulated voltage source; and
 a power switching level trigger circuit having a first silicon transistor, the base circuit of said first transistor being connected to said capacitor;
 whereby a light energy operative to trip said input level trigger circuit causes said power switching level trigger to be actuated for a predetermined period which is independent of temperature.

9. A control circuit according to claim 8 further comprising regenerative feedback means for causing said power switching circuit to latch so that once said power switching circuit is actuated said photocell loses control thereof.

References Cited

UNITED STATES PATENTS

| | | | |
|---|---|---|---|
| 2,947,875 | 8/1960 | Beck | 250—214 |
| 3,005,915 | 10/1961 | White et al. | 250—214 |
| 3,231,787 | 1/1966 | Knudson | 307—88.5 |
| 3,271,660 | 9/1966 | Hilbiber | 307—88.5 |
| 3,275,941 | 9/1966 | Brechling | 307—88.5 |

WALTER STOLWEIN, *Primary Examiner.*